United States Patent [19]

Tashiro et al.

[11] Patent Number: 4,811,684
[45] Date of Patent: Mar. 14, 1989

[54] PHOTO CVD APPARATUS, WITH DEPOSITION PREVENTION IN LIGHT SOURCE CHAMBER

[75] Inventors: Mamoru Tashiro; Kazuo Urata; Shunpei Yamazaki, all of Tokyo, Japan

[73] Assignee: Semiconductor Energy Laboratory Co., Ltd., Tokyo, Japan

[21] Appl. No.: 92,529

[22] Filed: Sep. 3, 1987

Related U.S. Application Data

[62] Division of Ser. No. 801,769, Nov. 26, 1985, abandoned.

[30] Foreign Application Priority Data

Nov. 26, 1984 [JP] Japan ............... 59-250339
Nov. 26, 1984 [JP] Japan ............... 59-250341

[51] Int. Cl.$^4$ ............... C23C 14/00; C23C 16/00
[52] U.S. Cl. ............... 118/50.1; 118/723; 427/54.1; 427/53.1
[58] Field of Search ............... 427/53.1, 54.1; 437/233, 241; 118/50.1, 723

[56] References Cited

U.S. PATENT DOCUMENTS 4,588,610 5/1986 Yamazaki ............... 427/54.1
4,623,426 11/1986 Peters ............... 427/54.1

*Primary Examiner*—Shrive Beck
*Assistant Examiner*—Marianne L. Padgett
*Attorney, Agent, or Firm*—Gerald J. Ferguson, Jr.

[57] ABSTRACT

A photo CVD apparatus for use with a reactive gas is disclosed, which includes a reaction chamber, a second chamber for a light source, separated from the reaction chamber by a transparent window. There is also a conduit connecting these two chambers and a means for preventing deposition by the reactive gas on the light source chamber walls, such as heating, is provided. Examples of this technique's applicabilities are given with such gases as $Si_2H_6$ or $Al(CH_3)_3$ and ammonia.

5 Claims, 1 Drawing Sheet

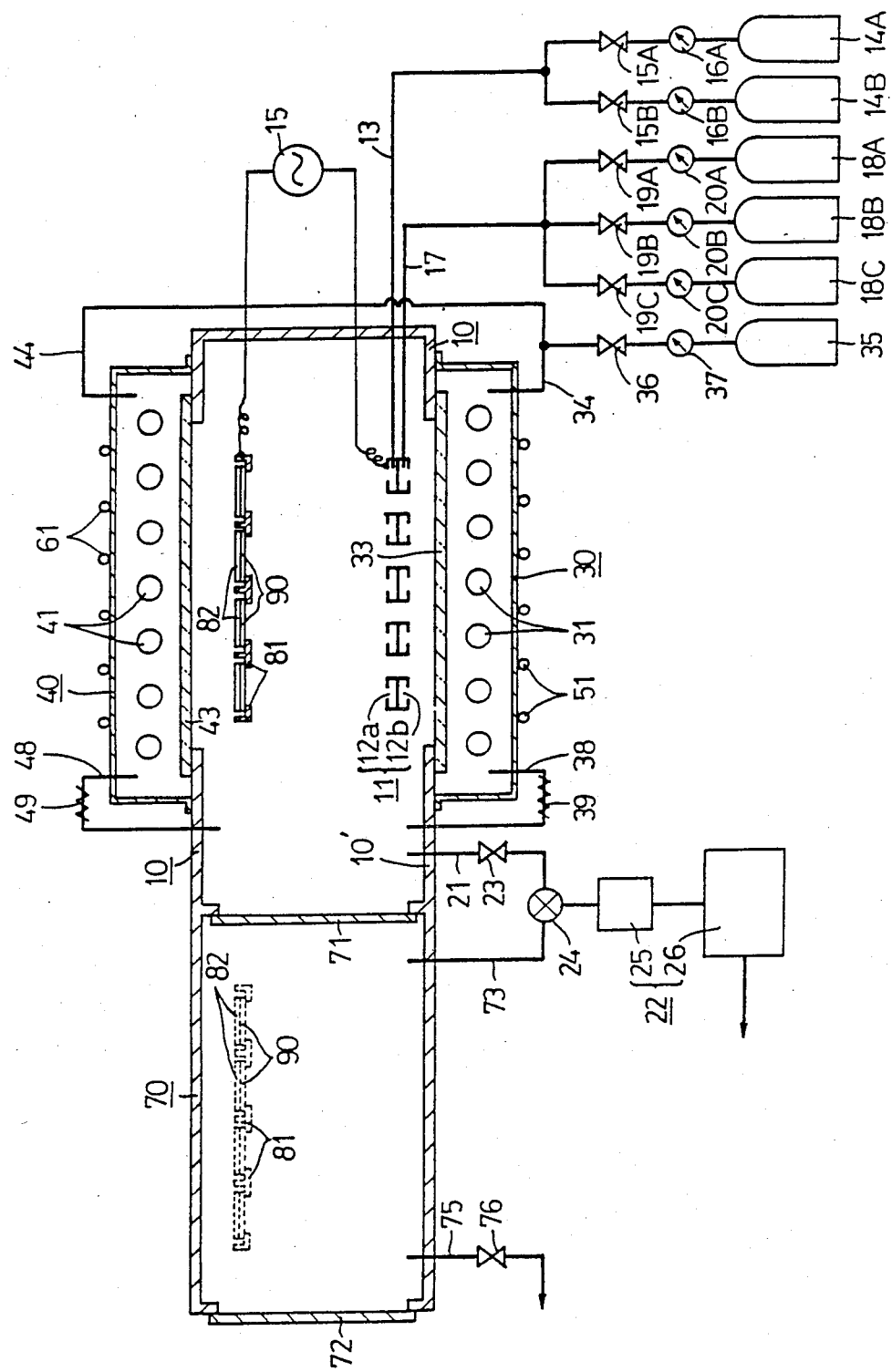

PHOTO CVD APPARATUS, WITH DEPOSITION PREVENTION IN LIGHT SOURCE CHAMBER

This application is a divisional of application Ser. No. 06/801,769 filed 11/26/85 and abandoned on 1/04/88.

BACKGROUND OF THE INVENTION

1. Field of the Invention

The present invention relates to a layer forming method and apparatus suitable for use in the fabrication of various electronic devices of the type having an insulating, protecting, conductive, semiconductor or like layer formed on a substrate member.

2. Description of the Prior Art

Heretofore there has proposed a method for forming such a layer on a substrate member through use of a photo CVD process.

According to the method utilizing the photo CVD technique, the substrate member is placed in a reaction chamber provided with a light transparent window and a reactive gas mixture, which contains at least a gas of a material for the formation of the layer desired to obtain, is introduced into the reaction chamber. Then light is introduced into the reaction chamber through the light transparent window thereof by which the reactive gas mixture introduced thereinto is excited for vapor-phase decomposition and the material for the layer is deposited on the substrate member.

With the photo CVD process, since the material gas resulting from the vapor-phase decomposition of the photo-excited reactive gas is not accelerated, it is possible to form the layer on the substrate with substantially no damage inflicted on the substrate surface. On this account the layer can easily be formed without containing the material forming the substrate surface or without introducing into the substrate surface the material forming the layer, without developing any undesirable interface level between the layer and the substrate and without applying any internal stress to the layer and the substrate. Furthermore, since the photo-excited material gas has a characteristic to spread on the surface of the substrate member, the layer can be deposited in close contact with the substrate even if the substrate surface is uneven.

Accordingly, the use of the photo CVD technique permits easy formation of the layer of desired characteristics, without causing any damages to the substrate surface, even if the substrate has an uneven surface.

With the photo CVD process, however, an unnecessary layer of the material for the layer is deposited as well on the light transparent window during the formation of the layer. On this account, in the case where after the formation of the layer on the substrate member, a new layer of a composition identical with or different from that of the abovesaid material is formed on a new substrate member in the reaction chamber, the light to be introduced into the chamber through the light transparent window is partly intercepted by the unnecessary layer deposited on the window, so that a reactive gas mixture cannot effectively excited. Consequently, much time is needed for depositing the new layer. A conventional solution to this problem is to coat the window with oil of fluorine series which prevents the deposition of such unnecessary layer. But, when the window is given such a coating of oil, the layer being formed on the substrate is doped with an unnecessary impurity contained in the coating.

SUMMARY OF THE INVENTION

It is therefore an object of the present invention to provide a novel layer forming method and apparatus therefor which are free from the abovesaid defects of the prior art.

The method of the present invention comprises the steps of forming a layer on a substrate by the photo CVD process in a reaction chamber and cleaning the reaction chamber by plasma etching before or after the layer forming step.

According to such a method of the present invention, since the layer is deposited by the photo CVD technique on the substrate, even if the substrate surface is uneven, the layer can be deposited in close contact with the substrate surface and with substantially no damage thereon. Accordingly, the layer does not substantially contain the material forming the substrate surface, or the substrate surface does not substantially contain the material forming the layer. Further, the deposition of the layer is not accompanied by provision of an undesirable interface level between the layer and the substrate and the application of internal stresses to the first layer and the substrate.

Furthermore, according to the present invention, the interior of the reaction chamber is cleaned by the reaction chamber cleaning step. That is, during the formation of the layer on the substrate the material for the layer is unnecessarily deposited on the interior surfaces of the reaction chamber. But the present invention removes such unnecessary deposits by the cleaning step.

Accordingly, a layer of an intended composition and desired characteristics can always be formed on the substrate without containing the deposited material.

Moreover, the apparatus of the present invention for the abovesaid layer forming method comprises a means for introducing a layer-forming reactive gas into the reaction chamber from the outside thereof, a means for introducing a cleaning gas into the reaction chamber from the outside thereof, a means for exhausting gas from the reaction chamber, a means for exciting the layer-forming reactive gas by light, the reactive gas exciting means is provided with a light source chamber which optically communicates with the reaction chamber through a light transparent window and in which is disposed a light source for emitting the light, and a means for exciting the cleaning gas by electric power into a plasma.

With such an apparatus of the present invention, the layer forming step according to the manufacturing method of the invention can easily be carried out using the reaction chamber, the layer-forming reactive gas introducing means, the gas exhaust means and the layer-forming reactive gas exciting means and the reaction chamber cleaning step can also be easily performed using the reaction chamber cleaning gas introducing means, the gas exhaust means and the reaction chamber cleaning gas exciting means. Accordingly, the apparatus of the present invention permits easy implementation of the method of the invention.

Other objects, features and advantages of the present invention will become more fully apparent from the following detailed description taken in conjunction with the accompanying drawings.

BRIEF DESCRIPTION OF THE DRAWING

The accompanying sheet of a drawing schematically illustrates an example of the layer forming method of the present invention and an example of the apparatus used therefor.

DESCRIPTION OF THE PREFERRED EMBODIMENTS

A description will be given first of an apparatus for the formation of a layer according to the present invention.

The apparatus has a conductive reaction chamber 10. The reaction chamber 10 is provided with a plurality of conductive nozzles 11 arranged at the lower portion of the chamber 10 and each having upper and lower nozzle parts 12a and 12b. The conductive nozzles 11 are connected to one end of a power supply 15 for gas excitation.

A gas introducing pipe 13 is connected to the upper nozzle parts 12a of the nozzle 11 and extends out of the reaction chamber 10. The gas introducing pipe 13 is connected to a gas source 14A via a valve 15A and a flowmeter 16A and to another gas source 14B via a valve 15B and a flowmeter 16B.

Another gas introducing pipe 17 is connected to the lower nozzle parts 12b of the nozzle 11 and extends out of the reaction chamber 10. The gas introducing pipe 17 is connected to a gas source 18A via a valve 18A and a flowmeter 20A, to a gas source 18B via a valve 19B and a flowmeter 20B and to a gas source 18C via a valve 19C and a flowmeter 20C.

The reaction chamber 10 is provided with an exhaust pipe 21 which extends to the outside through the bottom wall of its extending portion 10' wherein the nozzles 11 are not placed. The exhaust pipe 21 is connected to a vacuum pump system 22 via a control valve 23 and a change-over valve 24. The vacuum pump system 22 has a tandem structure of a turbo pump 25 and a rotary pump 26.

Provided on the bottom wall of the reaction chamber 10 is a light source chamber 30, in which is disposed light sources 31 each of which emits light having a wavelength 300nm or less, such as a low pressure mercury lamp. The light sources 31 are connected to an external power supply (not shown). Provided on the bottom wall of the chamber 30 are cooling pipes 51 which are connected to a cooling tower (not shown).

The reaction chamber 10 and the light source chamber 30 optically intercommunicate through a window 33 made in, for instance, a quartz plate disposd therebetween.

The light source chamber 30 has a gas introducing pipe 34 which extends to the outside through its one end portion of the bottom wall. The gas introducing pipe 34 is connected to a gas source 35 via a valve 36 and folwmeter 37. The light source chamber 30 has an exhaust pipe 38 which extends from the other end portion of the bottom wall of the chamber 30 into the extending portion 10' of the reaction chamber 10. A heater 39 is provided on the exhaust pipe 38.

Disposed on the upper wall of the reaction chamber 10 is a heat source chamber 40, in which is disposed a heat source 41 formed by, for example, a halogen lamp. The heat source 41 is connected to an external power supply (not shown). Provided on the top wall of the chamber 40 is cooling pipes 61 which are connected to the above said cooling tower.

The reaction chamber 10 and the heat source chamber 40 thermally intercommunicate through a window 43 made in, for example, quartz plate disposed therebetween.

The light source chamber 40 has a gas introducing pipe 44 which extends through its one end portion of the upper wall to the outside and is connected to abovesaid gas source 35 via the valve 36 and the flowmeter 37. The heat source chamber 40 has an exhaust pipe 48 which extends from its other end portion of the upper wall into the extending portion 10' of thee reaction chamber 10. A heater 49 is provided on the exhaust pipe 48.

The reaction chamber 10 has attached thereto on the side of its extending portion 10' a substrate take-in/take-out chamber 70 with a shutter means 71 interposed therebetween. The shutter means 71 is selectively displaced to permit or inhibit the intercommunication therethrough between the chambers 10 and 70.

The chamber 70 has another shutter means 72 on the opposite side of the shutter means 71. The chamber 70 has an exhaust pipe 73 which extends from its bottom to the vacuum system 22 via the aforementioned change-over valve 24. The chamber 70 has another pipe 75 which extends to the outside and terminates into the atmosphere via a valve 76.

The apparatus includes a conductive holder 81 for mounting a plurality of substrate members 90. The holder 81 is combined with thermally conductive press plates 82 for placing on the substrate members 90 mounted on the holder 81.

According to an example of the layer forming method of the present invention, the layer is deposited on the substrate member 90 through use of such an apparatus, as described hereinafter.

EMBODIMENT 1

A description will given of a first embodiment of the present invention for forming the layer as a insulating layer on the substrate member 90.

(1) The shutter means 71 between the reaction chamber 10 and the substrate take-in/take-out chamber 70, the shutter means 72 of the chamber 70 a valve 76 between the chamber 70 and the outside, the valves 15A and 15B between the nozzle parts 12a and the gas sources 14A and 14B, the valve 19A, 19B and 19C between the nozzle parts 12b and the gas sources 18A, 18B and 18C and the valve 36 between the chambers 30 and 40 and the gas source 35 are closed.

(2) Next, the valve 23 between the reaction chamber 10 and the vacuum pump system 22 is opened and change-over valve 24 is also opened to the both chambers 10, 70, 30 and 40 to a pressure of $10_{-7}$ Torr.

(3) Next, the turbo pump 25 and the rotary pump 26 of the vacuum pump system 22 are activated, evacuating the chambers 10 and 70.

(4) Next, the valve 23 is closed and the change-over valve 24 is also closed relative to the both chambers 10 and 70, following by stopping of the vacuum pump system 22 from operation.

(5) Next, the valve 76 is opened, raising the pressure in the chamber 70 up to the atmospheric pressure.

(6) Next, the shutter means 72 is opened, through which the substrate 90 mounted on a holder 81 with, its surface for the formation thereon of the layer held down, is placed in the chamber 70 with a press plate 82 mounted on the substrate 90.

(7) Next, the shutter means 72 and the valve 76 are closed.

(8) Next, the change-over valve 24 is opened to the chamber 70 alone and the pump system 22 is activated, evacuating the chamber 70 to substantially the same vacuum as that in which the chamber 10 is retained.

(9) Next, the change-over valve 24 is closed relative to the both chambers 10 and 70 and then the pump system 22 is stopped from operation.

(10) Next, the shutter means 71 is opened, the holder 81 carrying the substrate 90 is moved from the chamber 70 into the chamber 10 and disposed at a predetermined position in the upper part of the chamber 10. At this time, the holder 81 is connected to the other end of the power source 15.

(11) Next, the shutter means 71 is closed.

(12) Next, the heat source 41 in the heat source chamber 40 is turned ON, heating the substrate 90 up to a temperature of 350° C.

(13) Next, the light source 31 in the light source chamber 30 is turned ON.

(14) Next, the valve 19A connected to the lower nozzle part 12b of the nozzle 11 in the reaction chamber 10 is opened, through which ammonia gas ($NH_3$) is introduced as a first reactive material gas from the gas source 18A into the chamber 10. At the same time, the valve 23 is opened and the valve 24 is opened relative to the chamber 10 alone and, further, the pump system 22 is activated, raising the pressure in the chamber 10 to 3 Torr. Then the valve 15B connected to the upper nozzle parts 12a of the nozzle 11 is opened, through which disilane ($Si_2H_6$) is introduced as a second reactive material ga from the gas source 14B into the chamber 10 to provide therein a gas mixture of the ammonia gas and the disilane. The pressure in the chamber 10 is held at 3 Torr by regulating the valve 23. In this instance, exhaust pipes 38 and 48 between the chambers 30 and 40 and the reaction chamber 10 are heated by heaters 39 and 49 mounted thereon, respectively. Even if the gas mixture flows back from the reaction chamber 10 in the pipes 38 and 48 toward the chambers 30 and 40, it is vapor-decomposed by heat to deposit silicon nitride and silicon on the interior surfaces of the pipes 38 and 48, preventing the silicon nitride and silicon from deposition on the inside surfaces of the chambers 30 and 40. Furthermore, in order to prevent such a reverse flowing of the gas mixture, the valve 36 is opened, through which nitrogen or argon gas is introduced from the gas source 35 into the chambers 30 and 40.

In such a condition, the gas mixture is excited by light from the light source 31 desposed in the light source chamber 31, by which it is excited and vapor-decomposed, depositing a silicon nitride layer as a insulating layer on the substrate member 90 at a rate of 17A/min.

(15) Next, when the silicon nitride layer is deposited to a thickness of about 500 A the power source 15 is turned OFF and then the valves 15B 19A and 36 are closed but the valve 23 is fully opened, evacuating the chambers 10 and 30 to the same degree of vacuum as that under which the chamber 70 is held.

(16) Next, the valve 23 is closed and the pump system 22 is stopped and then the shutter means 71 is opened, through which the holder 81 carrying the substrate member 90 with the insulating layer deposited thereon is moved from the chamber 10 to the chamber 70.

(17) Next, the shutter means 71 is closed and then the valve 76 is opened, through which the pressure in the chamber 70 is raised to the atmospheric pressure.

(18) Next, the shutter means 72 is opened, through which the holder 81 is taken out to the outside and then the substrate member 90 having formed thereon the insulating layer is removed from the holder 81.

In the manner described above, the insulating layer as the layer is formed on the substrate 90.

(19) Next, the holder 81 with no subsrate member 90 mounted thereon is placed in the chamber 70, after which the shutter means 72 and the valve 76 are closed, the valve 24 is opened to the chamber 70 and the vacuum pump system 22 is put in operation, evacuating the chamber 70 to the same degree of vacuum as that under which the chamber 10 is retained.

(20) Next, the valve 24 is closed relative to the both chambers 70 and 10, after which the shutter means 71 is opened, through which the holder 81 is placed in the chamber 10, and then the shutter means 71 is closed.

(21) Next, the valve 19B connected to the lower nozzle parts 12b of the nozzle 11 is opened, through which nitrogen fluoride ($NF_3$ or $N_2F_4$) is introduced as a first cleaning gas form the gas source 18B into the chamber 10. On the other hand, the valve 23 is opened and the valve 24 is opened to the chamber 10 and then the pump system 22 is put in operation, holding the pressure in the chamber 10 at 0.1 Torr.

(22) Next, the power soruce 15 is turned ON.

In such a condition, the first cleaning gas is discharged or excited into a plasma by electric power from the power source 15, etching away unnecessary layers deposited on the inside surface of the chamber 10, the inside surfaces of the windows 33 and 34, the outside surface of the nozzle 11 and the outside surface of the holder 81. The unncessary layers are composed of the materials of above said first and second insulating layer.

(23) Next, when the unnecessary layers are almost etched away, the power source 15 is turned OFF and the valve 19B is closed, but the valve 19C is opened, through which hydrogen as a second cleaning gas, supplied from the gas source 18C, is introduced into the chamber 10, maintaining the pressure therein at 0.1 Torr.

(24) Next, the power source 15 is turned ON again. The second cleaning gas is discharged or excited into a plasma by electric power from the power source 15, cleaning the interior of the reaction chamber 10 including the windows 33 and 34, the nozzles 11 and the holder 81.

(25) Next, the power source 15 is turned OFF, after which the valve 19C is closed and the valve 23 is fully opened, through which the chamber 10 is evacuated. When the chamber 10 is evacuated to the same degree of vacuum as that under which the chamber 70 is retained, the valve 23 is closed, stopping the pump system 22 from operation.

Thus a series of steps for forming an insulating layer as a layer member on a substrate member is completed.

EMBODIMENT 2

Next, a description will be given of a second embodiment of the present invention for forming a semiconductor layer as the layer on a substrate member.

This embodiment forms an amorphous silicon layer as the semiconductor layer on the substrate member 90 by the same steps as those in Embodiment 1 except the following steps.

(12') In step (12) in Embodiment 1 the heating temperature of the substrate 90 is changed from 350° C. to 250° C.

(14') In step (14) of Embodiment 1 only the disilane ($Si_2H_6$) gas is introduced into the chamber 10 and the pressure in the chamber 10 is changed from 3 Torr to 2.5 Torr. A amorphous silicon layer is deposited as a semiconductor layer on the substrate 90.

EMBODIMENT 3

Next, a description will be given of a third embodiment of the present invention which forms an aluminum nitride (AlN) layer as a insulating layer on a substrate.

Embodiment 3 employs a same steps as those in Embodiment 1 except the following steps.

(14′) In step (14) of Embodiment 1 methyl aluminum (Al(CH$_3$)$_3$), instead of the disilane, is introduced from the gas source 14A into the chamber 10, whereby a first aluminum nitride (AlN) layer is deposited as a first insulating layer on the substrate 90. In this case, the deposition rate of the first aluminum nitride layer is 230 A/min.

EMBODIMENT 4

Next, a description will be given of a fourth embodiment of the present invention which forms a insulating composite layer.

Embodiment 4 employs a same steps as those in Embodiment 1 except that the following step is added between the steps (14) and (15).

When the silicon nitride layer is deposited as a first silicon nitride layer to a thickness of about 500 A on the substrate member 90, the valve 23 is regulated and when the pressure in the chamber 10 is reduced to 1 Torr, the power source 15 is turned ON and then the light source 31 is turned OFF.

In such a condition, the gas mixture of the ammonia gas and the disilane is discharged or excited by electric power from the power source 15 into a plasma, in consequence of which a second silicon nitride layer is deposited on the first silicon nitride layer at a rate 2.1 A/sec to a thickness of about 0.5 μm.

While in the foregoing the presentinvention has been described in conection with the cases of forming an insulating layer of silicon nitride or aluminum nitride, it is also possible to form an insulating layer different material selected from a group consisting of, for example, si$_3$N$_4$, SiO$_2$, phosphate glass, borosilicate glass, and aluminum nitride. Also it is possible to form a conductive layer of such a metal as aluminum, iron, nickel or cobalt. Furthermore, a semiconductor layer of a material selected from the group consisting of, for example, Si, Si$_x$C$_{1-x}$(where $0<x<1$), SiM$_x$(where $0<x<4$ and M is such a metal as Mo, W, In, Cr, Sn or Ga) can also be formed. Moreover, although in the foregoing a low pressure mercury lamp is employed as the light source, an excimer laser (of a wavelength 100 to 400 nm), an argon laser and a nitrogen laser can also be used. Furthermore HF gas, a gas mixture of NF$_3$ gas and H$_2$ gas, NCl$_3$ gas can also be used as the cleaning gas.

It will be apparent that many modifications and variations may be effected with out departing from the scope of the novel concepts of the present invention.

We claim:

1. A photo CVD apparatus comprising: a reaction chamber;
   a vacuum pump for evacuating said reaction chamber;
   means for inputting a reactive gas into said reaction chamber;
   a light source chamber provided on said reaction chamber and separated from the inside of said reaction chamber by a transparent window;
   a light source disposed in said light source chamber to irradiate the inside of said reaction chamber with light through said window; and
   a conduit connected with both said reaction chamber and said light source chamber for making communication therebetween wherein said conduit is provided with means for preventing said reactive gas from depositing as a solid product on the inside wall of said light source chamber.

2. An apparatus of claim 1 wherein said preventing means is a heater.

3. An apparatus of claim 1 further comprising a cooling pipe provided for said light source chamber.

4. An apparatus of claim 1 further comprising a heater room in which at least one heater is housed.

5. An apparatus of claim 4 wherein said heater room and said reaction chamber are connected with each other by a conduit.

* * * * *